United States Patent [19]

Lobel

[11] Patent Number: 5,598,431
[45] Date of Patent: Jan. 28, 1997

[54] METHOD AND APPARATUS FOR SIGNAL QUALITY DETECTION IN A COMMUNICATION SYSTEM

[75] Inventor: Gary S. Lobel, Ft. Worth, Tex.

[73] Assignee: Motorola, Inc., Schaumburg, Ill.

[21] Appl. No.: 363,769

[22] Filed: Dec. 23, 1994

[51] Int. Cl.$^6$ .................................................... H04B 3/46
[52] U.S. Cl. .................... 375/224; 370/252; 371/48; 371/67.1; 375/217; 375/226; 375/227; 375/228; 375/316; 455/67.3; 455/218; 455/222; 455/223; 455/226.1
[58] Field of Search ................................ 375/217, 224, 375/228, 316, 340, 351, 377; 455/67.1, 67.3, 218, 220–223, 226.1, 226.4; 370/13; 327/31,39, 34, 36, 37; 371/5.1, 48, 67.1; 364/550, 552

[56] References Cited

U.S. PATENT DOCUMENTS

| | | | |
|---|---|---|---|
| 4,387,461 | 6/1983 | Evans | 375/224 |
| 4,688,234 | 8/1987 | Robinton | 375/227 |
| 5,297,164 | 3/1994 | McCabe | 375/224 |
| 5,333,153 | 7/1994 | Brown et al. | 375/104 |

OTHER PUBLICATIONS

Publication ETSI–RES–30–Radio Equipment and Systems (RES) Common Air Interface Specification Jan. 31, 1994.

*Primary Examiner*—Stephen Chin
*Assistant Examiner*—Amanda T. Le
*Attorney, Agent, or Firm*—Barbara R. Doutre

[57] ABSTRACT

A signal quality detector (200) determines the quality of an incoming received data signal within a communication device (100). The audio output of the communication device is muted and unmuted according to the decision of the signal quality detector (200). The signal quality detector (200) allows the threshold length of an invalid bit period (210), along with the number of invalid bit periods detected (220), to be used to vary the decision sensitivity of the detector.

8 Claims, 4 Drawing Sheets

METHOD AND APPARATUS FOR SIGNAL QUALITY DETECTION IN A COMMUNICATION SYSTEM

TECHNICAL FIELD

This invention relates in general to digital communication systems, and more specifically to signal quality detection in digital communication systems.

BACKGROUND

Personal communication system (PCS) products such as second generation cordless telephone (CT2) and digital European cordless telephone (DECT) are examples of radio communication protocols. Signal quality in a radio communication system is an important decision making factor in maintaining a good communication link between communication devices. Information on the integrity of the link can be used to mute (squelch) audio or indicate error probability.

In today's digital communication devices which carry digitized voice, it is important to realize the situations that can occur during a communication session. When a communication link has been established and two parties are at opposite ends of the communication link, a reliable communication path must be maintained. If the communication path fails, the units should be capable of muting the digitized voice, thus preventing the end users form hearing noise bursts from corrupted receive data. In current systems there are very few ways to obtain this function, and the ways that are present are very slow to respond, easily falsed, or not practical to implement into existing systems.

In addition, in digital communication systems using time division multiplexing, synchronization is required so that a communication unit receiving information "knows" at what times the information is to be received. Once synchronization is achieved, the communication signals received are subject to deterioration for a variety of reasons. Among these are loss of transmission at the other end of the communication link, interference on the same or adjacent channel, and fading of the received signal due to increasing distance between the transmitting and the receiving units. When a "bad" signal (or portion of a signal) is received the user of the receiving unit may hear annoying pops or bursts, or possibly even lose the communication link. Thus, a need exists for an improved communication device that overcomes the aforementioned problems. Additionally, an apparatus and technique that can be readily implemented or retrofitted into existing hardware systems would provide a further cost benefit.

DETAILED DESCRIPTION OF THE PREFERRED EMBODIMENT

Figure 1:
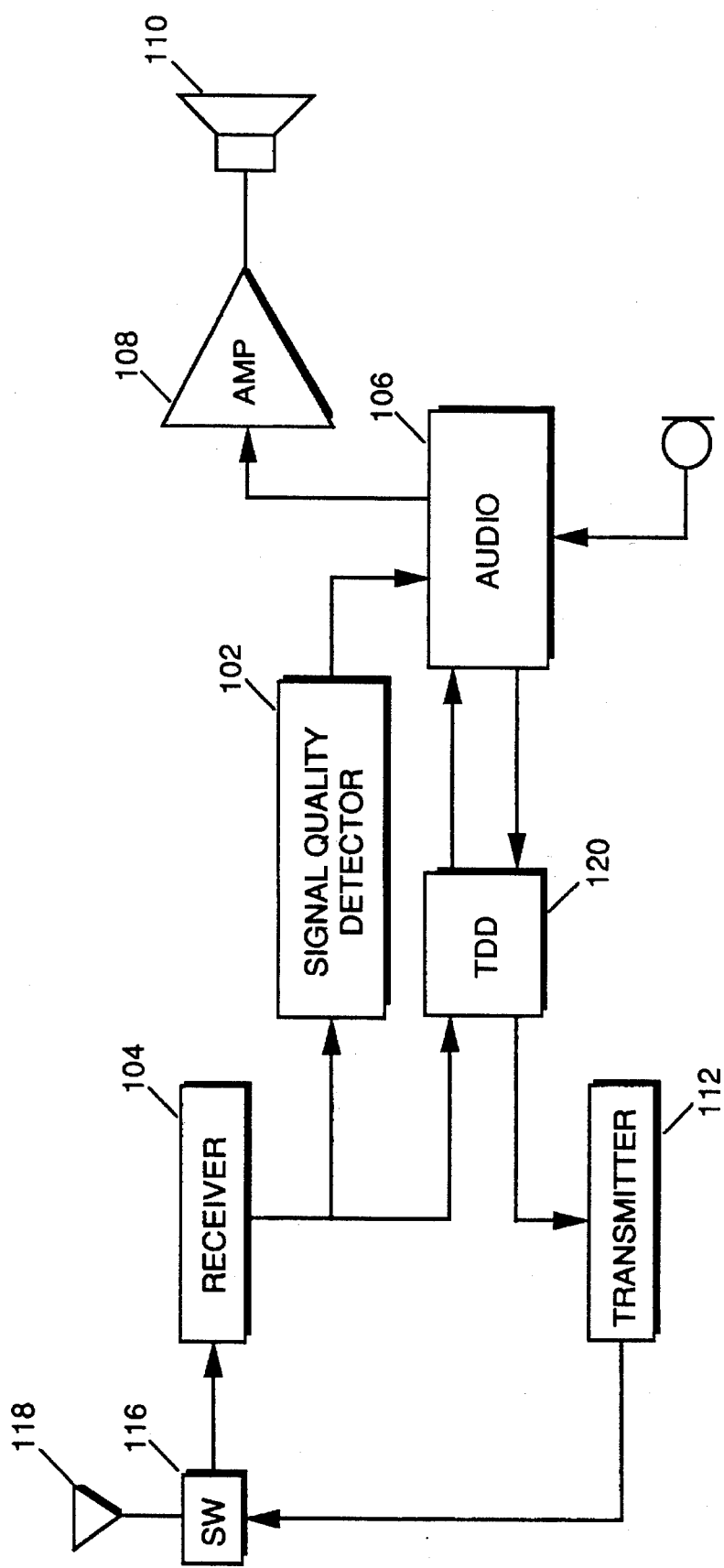
FIG. 1 is a simplified block diagram of a radio communication device including a signal quality detector in accordance with the present invention.

Referring to FIG. 1, there is shown a simplified block diagram of a communication device 100, preferably a radio telephone handset, having a signal quality detector 102 in accordance with the present invention. The handset 100 is preferably a CT2 handset which comprises a receiver front end 104, a receiver back end 122, and audio section 106, (including an amplifier 108 and speaker 110), and a transmitter section 112 for transmitting signals that include voice received at a microphone 114. The receiver is typically responsible for filtering, amplifying and mixing a received radio frequency (RF) signal into a first intermediate frequency (IF) signal and then converting the first IF signal to a baseband frequency signal to recover digital information contained on the incoming signal. The receiver includes a demodulator and center slicer (not shown). CT2 communication systems operate in accordance with a document entitled "Radio Equipment and Systems Common Air Interface Specification" (CAI) published by the Interim European Telecommunication Standards Institute (ETSI) and is hereby incorporated by reference. The CAI Specification establishes a time-division multiplexed protocol having alternating one millisecond receive and transmit frames separated by guard time segments. In one multiplexing scheme each transmit/receive segment includes a B channel (64 bits) and a D channel which contains 1 or 2 bits at each end of the B channel.

An antenna switch 116 is used for alternately switching the transmitter 112 and the receiver 104 to an antenna 118, in accordance with an established protocol. A time division multiplexer (TDD) 120 is coupled to the receiver, to the transmitter 112, and to the audio section 106 for providing time division multiplexing and receive/transmit flaming of the digital signals. The audio section 106 is used to control audio from the microphone 114 and from the receiver front end and includes a muting portion under the control of the signal quality detector 102.

The signal quality detector 102 is coupled externally to the TDD 120 and to the receiver front end 104, so that it can sample received digital signals to determine their quality. When the signal quality detector 102 determines that a predetermined portion of a received digital signal is not acceptable, it sends an audio "mute" signal to the audio section 106, causing the audio to mute instantaneously. This prevents the "bad" signal portion from being presented to a user of the handset 100, and consequently avoids the resulting noise burst problems.

Figure 2:
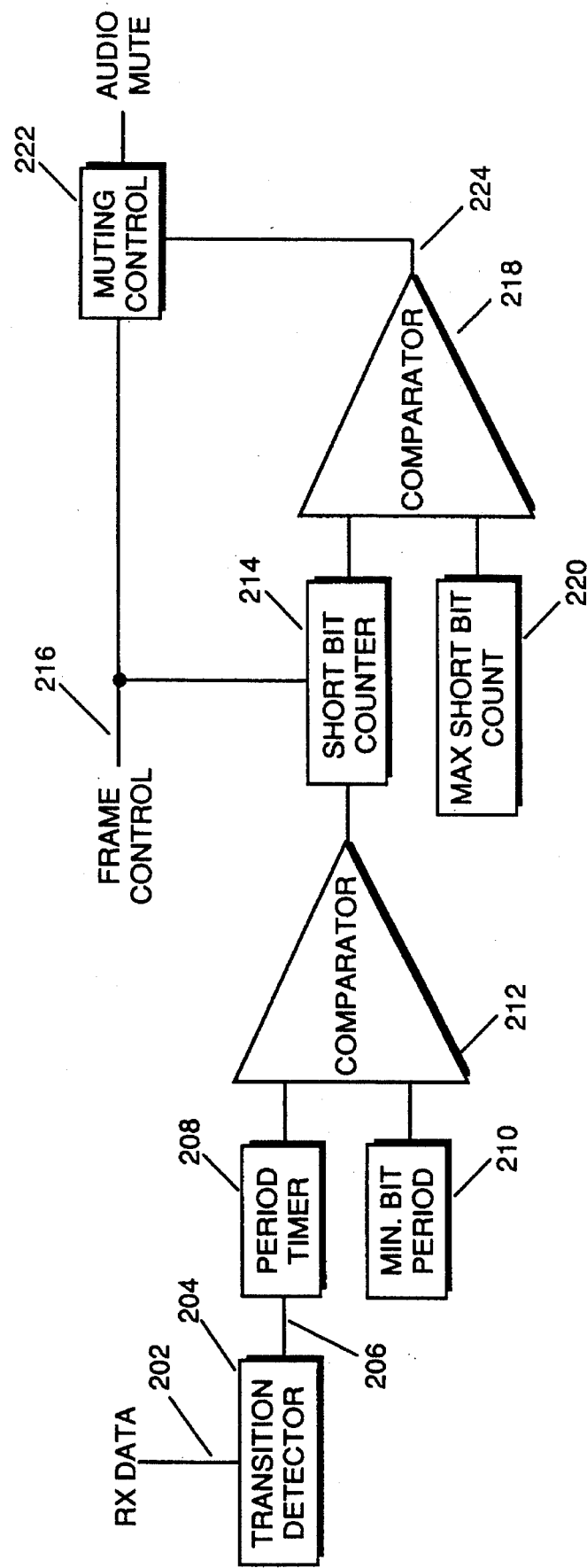
FIG. 2 is a block diagram of a signal quality detector in accordance with the present invention.

Referring now to FIG. 2, there is shown a block diagram of the signal quality detection circuit 102 of FIG. 1 (now referenced by designator 200) in accordance with the present invention. The signal quality detection circuit 200 determines the quality of the incoming received digital data signal 202 based on the number of incoming short bit transitions within a predetermined receive frame length. In a CT2 system a receive frame is 1 millisecond (ms) long, however, the signal quality detector circuit can be adjusted to accommodate various frame lengths for various systems. A short bit is a bit significantly shorter than the nominal bit length (nominal bit length is 13.88 microseconds for CT2). The exact bit length threshold programs the sensitivity of the signal quality detector (the longer the threshold, the more sensitive the detector).

The received data signal 202 is forwarded to a transition detector 204 where transitions in the data steam are detected. The transition detector 204 is preferably designed with logic gate circuitry (not shown), such as D flip flops as are well know in the art. The transition detector 204 generates a transition indicator signal 206 for every transition that occurs in the received data stream. These transition indicator signals 206 are forwarded to a period timer 208 which initializes a period of timing and terminates a previous period of timing with every received transition. The output signal generated by the period timer 208 indicates the period of the transition indicator signal. The period timer can be implemented using a counter or similar logic circuitry (not shown) as well known in the art.

A minimum bit period value 210 is preset to define the length of a "short bit". This preset value is preferably hardwired into the detection circuit 200 using switches or jumpers, however, one skilled in the art recognizes that this preset value could also be controlled by a value stored in memory and programmed by a microprocessor (not shown). In a CT2 system, periods less than half of a single bit, are an indication of degraded signal quality and increased bit error rate. Typically, the shorter the bit length, the worse the received signal, although a conclusion can not be drawn from a single bit. The number of short bits in a frame gives a better indication of the signal quality. Short bits are random, resulting from erroneously de-modulated data (the more receive errors, the more short bits). The short bit threshold is chosen to take into account the demodulator's response time. A slow demodulator may incur nonsymmetrical delays which cause many of the received bits to be outputted at shorter than the nominal bit length. By adjusting the minimum bit period value 210, the short bit length threshold can be made shorter to account for these delays. Hence, the threshold length of an "invalid" bit period can be used to vary the decision sensitivity of the detector and account for the demodulator's response time. The minimum bit period value is then compared to the period measured between transition indicator signals at a comparator 212. The comparator 212 then generates an output signal, preferably in the form of a pulse, indicating the presence of a short bit.

The pulse signal generated by the comparator 212 is forwarded to a short bit counter 214 which counts the number of short bits. The short bit counter 214 is preferably under the control of a frame control signal 216 that sets a predetermined time frame over which to count the number of short bits. The frame control signal 216 is preferably generated from an existing clock signal in the system that represents the frame protocol being used. The frame control signal 216 is preferably long enough to encompass a reasonable number of bits (due to the randomness of errored data, the sample size should be long enough to give a good average representation) and short enough to allow a quick response time. For example, a CT2 frame of 72 bits and 2 ms is a reasonable selection, and an available signal in most CT2 implementations. Alternatively, the frame control value can be set in hardware using a separate clock circuit. Systems such as DECT can use existing slot signals, or a value configured in hardware, as the frame control signal representing the protocol.

Once the time frame for counting the number of short bits is completed, a second comparator 218 compares the total number of short bits to a maximum short bit count 220. The maximum short bit count is preferably controlled by a value stored in memory and programmed by the microprocessor (not shown). This short bit count 220 has the most effect on the sensitivity of the signal quality detector 200. At the end of the receive frame, if the maximum short bit count has been exceeded, the second comparator 218 generates a logic signal indicating a mute or unmute control signal 224. The mute/unmute control signal 224 remains at the last logic level, indicating mute or unmute for the entire period, until the next frame issues new information. The mute/unmute control signal 224 is directed to a muting control function 222, preferably located within the audio portion 106 shown in FIG. 1, that controls the muting of the audio. The frame control 216 is directed to the muting control function 222 to indicate that new signal quality data is present. Muting may be performed immediately upon the short bit count exceeding the maximum, however, unmuting waits for the end of the frame. Both muting and unmuting functions are preferably sampled at the end of a frame.

Figure 3:
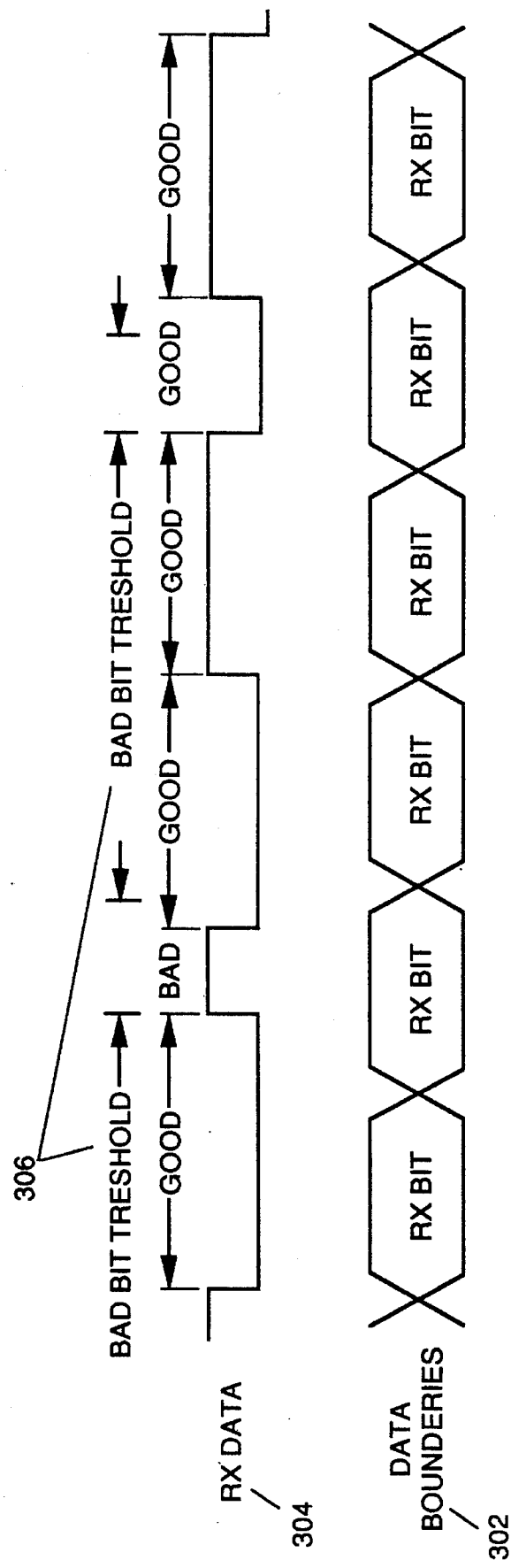
FIG. 3 is a timing diagram comparing the received data to a bad bit threshold in accordance with the present invention.

Referring to FIG. 3, there is shown the relationship between preset data boundaries and the received data signal. The minimum bit period 210 in FIG. 2 establishes the bad bit threshold 306, data boundaries 302 represent the nominal bit period, and the actual receive digital data is represented by signal 304. The first 'shorter than nominal bit' (labeled bad) is less than the minimum bit length 306, while the latter 'shorter than nominal bit' is greater than the minimum bit length 806. The minimum bit length is measured from the start of each transition regardless of where it falls within the boundaries 802.

Figure 4:
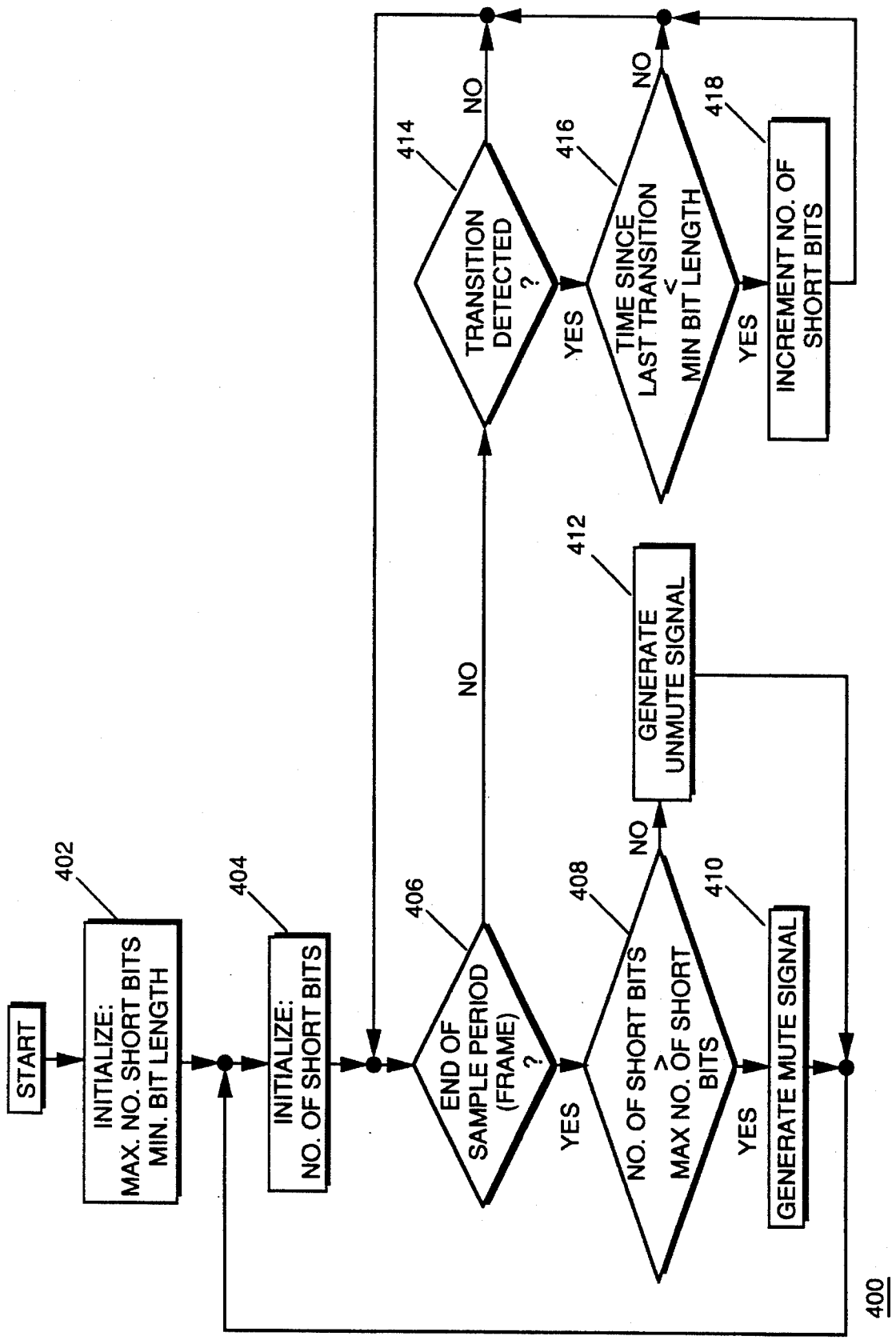
FIG. 4 is a flow chart of an audio muting and unmuting method in accordance with the present invention.

Referring to FIG. 4 of the accompanying drawings there is shown a flowchart 400 representing the method involved in determining the quality of an incoming signal using the signal quality detector in accordance with the present invention. In step 402, initialization of the maximum number of short bits and the minimum bit length occurs. Step 404 initializes the number of short bits in the short bit counter. Step 406 determines if the end of a frame has been reached, and if so, the number of short bits acquired is then compared to the maximum threshold of short bits in step 408. If the number of short bits exceeds the maximum threshold of step 408, a mute signal is generated at step 410. After a mute is generated at step 410, the number of short bits is reinitialized at step 404. If the number of short bits does not exceed the maximum threshold at step 408, an unmute signal is generated at step 412, and the routine returns to step 404 for the re-initialization of the short bit counter. Although not shown, the unmute short bit count threshold may be of a different value than the mute threshold, thus providing a level of hysterisis in the mute path.

At step 406, if the end of a frame has not been reached, a check for a transition detection is made at step 414. If no transition detection occurs at step 414, the routine is returned to step 406. If, however, a transition is detected at step 414, the time since the last transition is compared to the minimum bit length at step 416. If the time since the last transition is less than the minimum bit length, indicating a "bad" bit, at step 416, then the number of short bits is incremented at step 418, and the routine is returned to step 406 to check for the end of a frame again. If the time since the last transition is not less than the minimum bit length at step 416, indicating a "good" bit, the routine is returned to step 406 without incrementing the short bit counter.

In flow chart 400 the mute signal occurs when both the maximum short bit threshold 408 is exceeded and the end of the frame is reached 406. However, the mute signal can also be generated based solely on the maximum number of short bits being exceeded. This may provide timing advantages in systems where the acquire time is much longer than the 2 ms of CT2. Only the unmuting signal requires that both the end of frame condition 406 and short bit threshold condition 408 be met.

Hence, the signal quality detector, as described by the invention, provides an improvement in the received signal quality of a communication device. The above described method and apparatus can be readily implemented and retrofitted into existing hardware systems including handsets and base stations and can be adjusted to suit various communication protocols.

The signal quality detector, as described by the invention, allows the threshold length of an "invalid" bit period, along with the number of invalid bit periods detected, to be used to vary the decision sensitivity of the detector. A further benefit of the signal quality detector, as described by the invention, is that it does not depend on frame alignment or bit alignment, thereby not requiring receive signal synchronization, which eases the implementation of the circuit into existing hardware systems.

What is claimed is:

1. A method for muting the audio output of a communication device, comprising the steps of:

receiving digital data;

determining transitions within the digital data;

determining the time between transitions;

comparing the time between transitions to a first predetermined threshold;

generating a signal in response to the first predetermined threshold not being exceeded;

counting the number of generated signals over a predetermined receive frame;

comparing the number of generated signals to a second predetermined threshold;

generating a first control signal when the number of generated signals exceeds the second predetermined threshold;

muting the audio output in response to the first control signal;

determining the end of the predetermined receive frame;

generating a second control signal when the number of generated signals does not exceed the predetermined threshold; and unmuting the audio output in response to the second control signal and the end of the predetermined receive frame being determined.

2. A method as described in claim 1, further comprising the steps of:

muting the audio output in response to the second control signal prior to the end of the predetermined receive from being determined.

3. A method of muting audio in a communication device, comprising the steps of:

receiving digital data in the form of bits;

determining if a bit transition is detected;

determining the elapsed time between a current bit transition and a previous bit transition;

comparing the elapsed time to a predetermined bit length;

incrementing a counter in response to the elapsed time between the current transition and the previous transition being less than the predetermined bit length;

muting the audio when the counter exceeds a predetermined threshold;

determining whether the end of a receive frame is received; and unmuting the audio when the counter does not exceed the predetermined threshold and the end of a receive frame has been determined.

4. A method as described in claim 3, further comprising the steps of, prior to the step of receiving the digital data:

demodulating a radio frequency signal;

determining the response time of the demodulated signal; and selecting the predetermined bit length based on the response time of the demodulated signal.

5. A method of muting audio in a communication device, comprising the steps of:

establishing a muting threshold;

establishing an unmuting threshold;

receiving digital data in the form of bits;

determining if a bit transition is detected;

determining the elapsed time between a current bit transition and a previous bit transition;

comparing the elapsed time to a predetermined bit length;

incrementing a counter in response to the elapsed time between the current transition and the previous transition being less than the predetermined bit length;

muting the audio when the counter exceeds the muting threshold;

determining whether the end of a receive frame is received; and unmuting the audio when the counter exceeds the unmuting threshold and the end of a receive frame has been determined.

6. A radio communication device, comprising:

a receiver section for receiving radio signals when a communication link is established with another radio communication device, the radio signals comprising digital information;

an audio section for producing output audio signals representing the radio signals received by the receiver section and including a muting function;

a signal quality detection portion for sampling the radio signals received from the receiver section, the signal quality detection portion, comprising:

a detector for detecting transitions in the digital information;

a first counter for determining the time between each transition within the digital information;

a first comparator for comparing the time between each transition to a predetermined threshold and providing an output signal representing invalid data transitions when the predetermined threshold is not exceeded;

a second counter for counting the number of invalid data transitions over a predetermined time frame;

a second comparator for comparing the number of invalid data transitions received over the predetermined time frame and comparing that number to a predetermined threshold, said second comparator generating a muting control signal in response to the predetermined threshold being exceeded, and said second comparator generating an unmuting control signal in response to the predetermined threshold not being exceeded, said muting and unmuting control signals provided to said audio section;

said audio section being muted in response to the muting control signal; and said audio section being unmuted in response to the unmuting control signal being received at the end of the predetermined time frame.

7. A communication device as described in claim 6, wherein the radio communication device is a second generation cordless telephone (CT2).

8. A communication device as described in claim 6, wherein the radio communication device is a digital European cordless telephone (DECT).

* * * * *